(12) United States Patent
Maksimovic et al.

(10) Patent No.: US 7,595,686 B2
(45) Date of Patent: Sep. 29, 2009

(54) DIGITAL CONTROLLER FOR HIGH-FREQUENCY SWITCHING POWER SUPPLIES

(75) Inventors: Dragan Maksimovic, Boulder, CO (US); Benjamin James Patella, Fort Collins, CO (US); Aleksandar Prodic, Toronto (CA); Sandeep Chaman Dhar, Boulder, CO (US)

(73) Assignee: The Regents of the University of Colorado, Boulder, CO (US)

( * ) Notice: Subject to any disclaimer, the term of this patent is extended or adjusted under 35 U.S.C. 154(b) by 303 days.

(21) Appl. No.: 10/498,337

(22) PCT Filed: Dec. 9, 2002

(86) PCT No.: PCT/US02/39189

§ 371 (c)(1),
(2), (4) Date: Aug. 18, 2005

(87) PCT Pub. No.: WO03/050637

PCT Pub. Date: Jun. 19, 2003

(65) Prior Publication Data

US 2006/0055574 A1 Mar. 16, 2006

Related U.S. Application Data

(60) Provisional application No. 60/338,712, filed on Dec. 7, 2001.

(51) Int. Cl.
*G05F 1/10* (2006.01)
*H02M 3/335* (2006.01)
*H03K 5/14* (2006.01)
*H03K 7/08* (2006.01)

(52) U.S. Cl. .................. 327/540; 327/176; 327/277; 341/161; 363/21.11

(58) Field of Classification Search .................. None
See application file for complete search history.

(56) References Cited

U.S. PATENT DOCUMENTS

| 5,396,247 A | 3/1995 | Watanabe et al. |
| 5,475,296 A * | 12/1995 | Vinsant et al. ............. 323/223 |
| 5,631,550 A | 5/1997 | Castro et al. |

(Continued)

FOREIGN PATENT DOCUMENTS

JP 59-02557 9/1984

(Continued)

OTHER PUBLICATIONS

Japanese Patent Office; Notice of Reasons for Rejection; Japanese Patent Application No. 2003-551629; Jan. 30, 2009; 3 pages.

*Primary Examiner*—Lincoln Donovan
*Assistant Examiner*—Terry L Englund
(74) *Attorney, Agent, or Firm*—Hensley Kim & Holzer, LLC

(57) ABSTRACT

A voltage controller (150), the controller comprising: a voltage comparator (700) operative to provide a digital error signal (152); a compensator (300) operative to determine a digital control signal (154) based on said provided error signal; and a modulator (400) operative to provide a power control signal (156) based on said determined digital control signal, wherein said comparator, said compensator, and said modulator are implemented entirely with digital logic gates.

27 Claims, 14 Drawing Sheets

U.S. PATENT DOCUMENTS

| | | |
|---|---|---|
| 6,005,337 A | 12/1999 | Papp et al. |
| 6,005,377 A | 12/1999 | Chen et al. |
| 6,140,777 A | 10/2000 | Wang et al. |
| 6,225,795 B1 * | 5/2001 | Stratakos et al. ............ 323/283 |
| 6,653,964 B2 * | 11/2003 | Mizuno et al. .............. 341/155 |
| 6,833,691 B2 * | 12/2004 | Chapuis ..................... 323/283 |
| 6,844,710 B2 * | 1/2005 | Lipcsei et al. ............... 323/284 |

FOREIGN PATENT DOCUMENTS

| | | |
|---|---|---|
| JP | 04-197075 | 7/1992 |
| JP | 05-259907 | 10/1993 |

* cited by examiner

DIGITAL CONTROLLER FOR HIGH-FREQUENCY SWITCHING POWER SUPPLIES

RELATED APPLICATIONS

The instant application claims the benefit of U.S. Provisional Patent Application No. 60/338,712, filed 12 Dec. 2001, entitled "Digital Controller for High Frequency Switching Power Supplies", the disclosure of which application is hereby incorporated by reference. This instant application also claims priority to U.S. patent application Ser. No. 10/291,098 entitled "Adaptive Voltage Regulator for Powered Digital Devices", filed 8 Nov. 2002, and issued as U.S. Pat. No. 7,061,292 on Jun. 13, 2006, the disclosure of which application is hereby incorporated by reference.

BACKGROUND OF THE INVENTION

1. Field of the Invention

The invention relates in general to voltage control and in particular to digital voltage control for high frequency voltage regulators.

2. Statement of the Problem

Analog voltage controllers are widely used in cooperation with power converters for DC-DC (direct-current to direct-current) converters. Analog controllers are fast and can generally be built with widely available analog components. However, the operation of analog controllers depends on the precision of the individual components included therein. Accordingly, considerable effort must be expended to ensure selection of analog components adhering to very precise quality control standards. Moreover, even after such careful selection, the behavior of analog components is subject to variations in manufacturing processes, operating temperatures, and degradation over time. Moreover, analog designs are not readily realized employing existing automated design methods. Accordingly, the design of analog controllers tends to be time-consuming and labor intensive.

Some existing voltage controllers include one or more digitally implemented components. However, the digital components implemented in existing voltage controllers have not performed as desired. For example, digital signal processors (DSPs) have been implemented to perform arithmetic operations, such as multiplication, as part of the operation of a compensator, within a voltage controller. However, these DSP implementations are slow, take up a lot of space, and are excessively complex for the task being performed. Moreover, because the DSPs require digital data to operate, their implementation incurs the need for large and energy-expensive analog to digital converters (ADCs). The ADCs included in such controllers are precision analog components which take up an inordinate amount of valuable space on chips, consume large amounts of power, and are subject to the same temperature-induced and process-induced performance variations as are analog components of the older existing controllers.

Accordingly, the art of voltage control would benefit from the provision of a voltage controller which is small, energy and space-efficient, and whose performance is not dependent of the temperature and process variations of individual controller components.

SUMMARY OF THE INVENTION

The present invention advances the art and helps to overcome the aforementioned problems by providing a small, fast, accurate, energy-efficient voltage controller, the performance of which is independent of temperature-variations and other variations in the characteristics of component parts. In the preferred embodiment, all functions of the inventive controller are implemented employing digital logic gates, thereby avoiding the need for, and the performance variations of, precision analog components. In the preferred embodiment, the digital logic gates forming the inventive controller can be effectively modeled employing existing electronic design automation, such as hardware description languages (HDLs), thereby simplifying and shortening design time.

A delay line ADC, preferably consisting exclusively of digital logic gates, preferably provides a digitally encoded error signal indicative of a disparity between an output voltage and a reference voltage. The delay line ADC disclosed herein thereby preferably performs the function associated with analog voltage comparison devices in existing analog controllers. Separately, the delay line ADC preferably performs the function of a combination of an ADC and a digital voltage comparison device in existing partially digitally implemented voltage controllers.

In the preferred embodiment, a hybrid digital pulse width modulator and compensator are also digitally implemented. In the preferred embodiment, the compensator includes a lookup table for rapidly converting a digital error signal from the delay line ADC into a digital control signal, which is preferably a digitally expressed duty ratio, provided as output from the compensator. In the preferred embodiment, a digital pulse width modulator receives the compensator-provided digital control signal as input and converts this digital signal into a duty ratio-controlled time varying control signal as output from the controller. Preferably, the controller output is provided to a power converter to increase or decrease the regulator output voltage, depending on the results of a comparison between the output voltage and the reference voltage.

The advantages of implementing the digital controller technology disclosed herein include the following. A fully digital controller could be very attractive in high-frequency, low-to-medium power DC-DC converters because of the inherently lower sensitivity to process and parameter variations, the ready programmability of various controller performance characteristics, the reduction or elimination of passive components for tuning, and the ease of integration with other digital systems. A benefit arising from compensator programmability and from the absence of the need to tune passive components is that the same controller hardware could be used with a range of power converter configurations and power-stage parameter values. In addition, with digital controller implementation, it is possible to implement control schemes that are impractical for analog controller designs.

For example, it is desirable to have the ability to precisely match phase-shifted duty ratios to a simple, robust control for voltage regulator modules (VRMs) using a dedicated digital controller IC (integrated circuit). In transformer-isolated DC-DC converters, digital signal transmission through the isolation can be used to address limited bandwidth and/or large gain variations associated with standard analog approaches. In general, more sophisticated control methods could be used to achieve improved dynamic responses.

Another advantage of the digital approach is that well established and automated digital design approaches can be applied. A controller design may be described at the functional level using a hardware description language (HDL). Preferably, synthesis, simulation, and verification tools are available to target the design to implementation to standard cell ASICs (application-specific integrated circuits) or FPGAs (field programmable gate arrays) from the HDL description. The design can then be implemented employing different manufacturing processes, integrated with other digital systems, or modified to meet updated specifications. In contrast to analog IC controller realizations, the digital controller design preferably scales well, and can thus take advantage of advances in fabrication technologies, without design alteration.

The above and other advantages of the present invention may be better understood from a reading of the following description of the preferred exemplary embodiments of the invention taken in conjunction with the drawings in which:

DETAILED DESCRIPTION OF THE PREFERRED EMBODIMENT

In this disclosure, a transistor terminal is either the source or drain of a field effect transistor (FET) or the emitter or collector of a bipolar junction transistor (BJT). Herein, a comparator is any device that receives two voltage values and which provides as output a signal indicative of a difference between the two received voltage values. Herein, the terms "comparator" and "voltage comparator" are used interchangeably. In this disclosure, energy-storing components include both analog and digital devices, including for instance, capacitors, inductors and powered digital logic gates. The term "energy-storing components" is intended to exclude wiring and other conductive apparatus operative merely to connect one electronic component to another. Herein, a resistor is a device having resistance concentrated in a lump form. Herein, a resistor does include wiring or other conductive links between electronic components. Herein, an electronic memory is a digital electronic storage device able to supply stored values in response to an identification of an address in the electronic memory of the stored values. Herein, a digital electronic calculator may include a digital electronic storage device and/or digital devices for performing arithmetic operations including any one or more of addition, subtraction, multiplication, and/or division.

Herein, a signal tap array may include any number of signal taps. A signal tap array preferably includes a plurality of signal taps, each tap connected to one delay cell within an array of delay cells. However, a signal tap array may include signal taps connected to only a subset of delay cells within a delay cell array. Herein, binary digital code is conventional digital code in which a sequence of bits identifies coefficients of values equal to number "2" raised to different powers. For example, digital code "101" corresponds to $1 \cdot 1 + 0 \cdot 2 + 1 \cdot 4 = 5$. Binary digital code is distinguished from "thermometer code" in which each bit in a sequence is of equal numerical weight.

Figure 1:
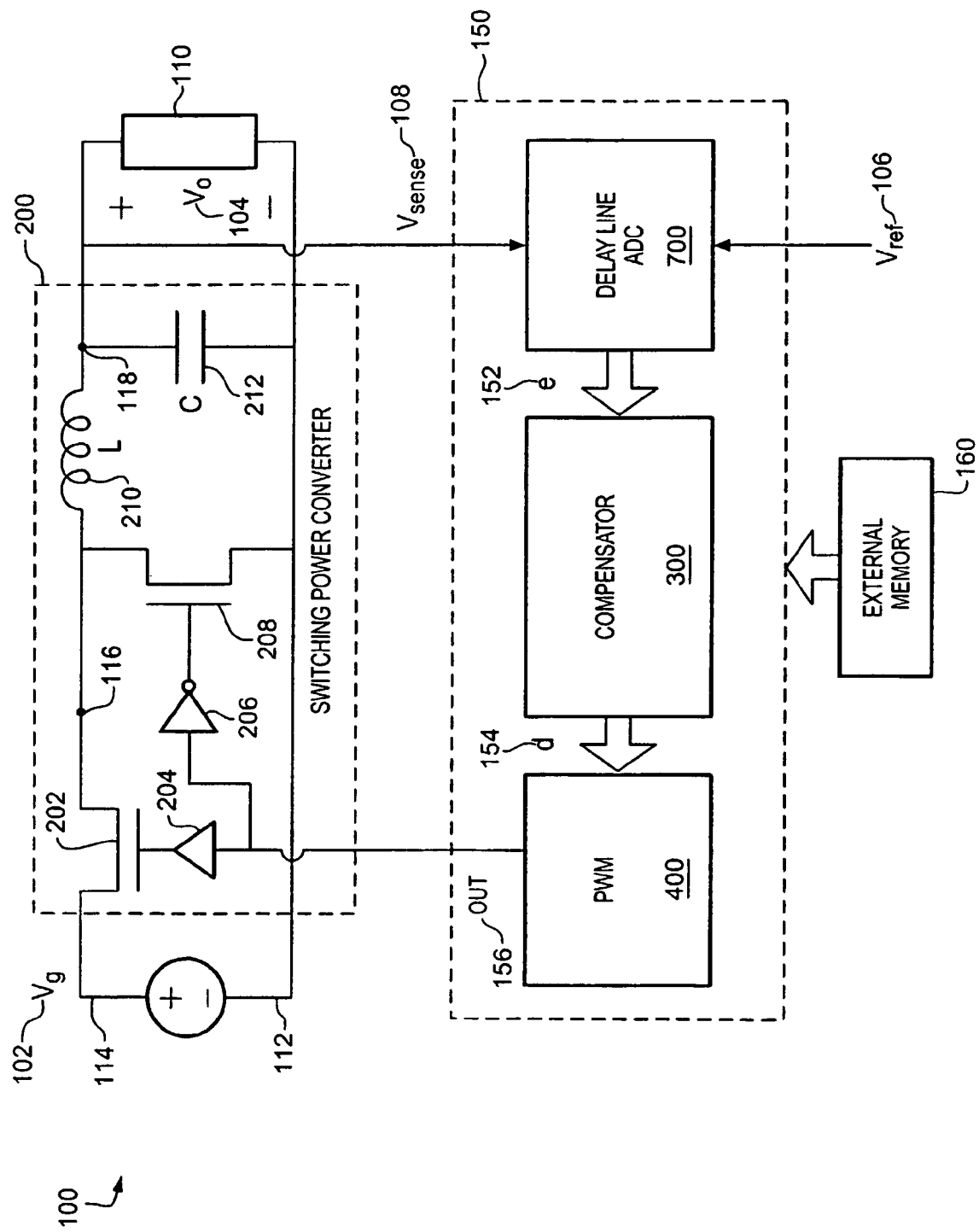
FIG. 1 is a block diagram of a voltage regulator including a digital voltage controller according to a preferred embodiment of the present invention.

FIG. 1 is a block diagram of a voltage regulator 100 including a digital voltage controller 150 according to a preferred embodiment of the present invention. Regulator 100 preferably includes power converter 200 and controller 150. Power converter ("converter") 100 is preferably a synchronous buck converter. Power converter preferably includes gate driver 204 which is connected to the gate of transistor switch 202, a first terminal of which transistor is connected to supply voltage 102 positive node 114 and a second terminal of which is connected to node 116. Gate driver 206 provides an output connected to the gate of transistor switch 208, one terminal of which transistor is connected to supply voltage negative node 112 and the other terminal of which is connected to node 116. Inductor 210 is preferably located between node 116 and node 118. Capacitor 212 is preferably located between node 118 and node 112.

In the embodiment of FIG. 1, power converter 200 is connected to supply voltage $V_g$ 102 and produces output voltage $V_o$ 104 which is connected between node 118 and node 112 of converter 200 across load 110, which is connected in parallel with capacitor 212. The operation of converter 200 is known in the art and is therefore not discussed in detail in this disclosure. It will be appreciated that the present invention is not limited to the design of converter 200. A wide range of designs and principles of operation may be incorporated into converter 200 which would not affect the operation of the preferred embodiment of controller 150. It will be appreciated that converter 200 of FIG. 1 is merely one of many converter designs which could be employed in conjunction with controller 150.

In the preferred embodiment, controller 150 includes delay line ADC 700, compensator 300, and pulse width modulator (PWM) 400, which is preferably a hybrid digital pulse width modulator. Preferably, voltages $V_{sense}$ 108 and $V_{ref}$ 106 are inputs to controller 150, and, in particular, to delay line ADC 700. Equipment (not shown) for providing $V_{ref}$ 106 is preferably not part of controller 150. Preferably, external memory 160 is available to supply information to compensator 300, when needed. Delay line ADC 700 preferably serves as a voltage comparator in the embodiment of FIG. 1. While delay line ADC 700 is the preferred voltage comparator in the present application, the current invention is not limited to the use of delay line ADC 700 for generation of a signal indicative of a voltage difference between voltages $V_{sense}$ 108 and $V_{ref}$ 106. In alternative embodiments, a range of devices, either analog or digital, for providing a signal indicative of a voltage difference between two voltage sources may be employed in controller 150, and all such variations are intended to be included within the scope of the present invention.

In this embodiment, converter 200 and controller 150 form a closed-loop feedback system 100, to preferably regulate output voltage $V_o$ 104 to match a stable voltage reference $V_{ref}$ 106 (or a scaled version of the reference) over a range of input voltage 102 values and load currents, and over a range of process and temperature variations. In this embodiment, output voltage 104 is sensed and compared to $V_{ref}$ 106. Digital error signal 152 is preferably transmitted to compensator 300. Compensator 300 output (digital control signal) 154 is the input to pulse width modulator 400, which in turn preferably produces a constant frequency variable duty ratio signal (power control signal) 156 to control the switching power transistors 202, 208. The preferred embodiment of a digital controller architecture to implement this control scheme is shown in FIG. 3.

Preferably, $V_{sense}$ 108 is a scaled version of Vo 104. Expressing this mathematically, we have $V_{sense}=HV_o$. However, in this disclosure, for the sake of simplicity, H is considered to have a value of 1. Thus, for the remaining discussion, $V_{sense}$ 108 and $V_o$ 104 have the same value. Preferably, Vo 104 is sampled by an A/D (analog to digital) converter to produce digital error signal e(n) 152. Preferably, sampling of Vo 104 occurs once per switching period $T_s$. Here, the index value of "n" refers to the current switching period.

Generally, effective voltage regulation generally requires that $V_o(t)$ 104 remain within a defined range of $V_{ref}$ 106, from $V_{ref}-(\Delta V_o)_{max}/2$ to $V_{ref}+(\Delta V_o)_{max}/2$. Otherwise stated, the permissible range for steady-state output voltage 104 is $V_o=V_{ref}\pm\Delta V_o/2$. To maintain Vo 104 within the permissible range, the analog equivalent of the least significant bit (LSB) in the A/D characteristic should not be greater than the desired magnitude of $\Delta V_o$. Preferably, the specifications for $\Delta V_o$ and $(\Delta V_o)_{max}$ are such that only a few digital values are needed to represent the magnitude of the analog voltage error, which is equal to $V_{ref}$ 106−$V_{sense}$ 108.

Figure 3:
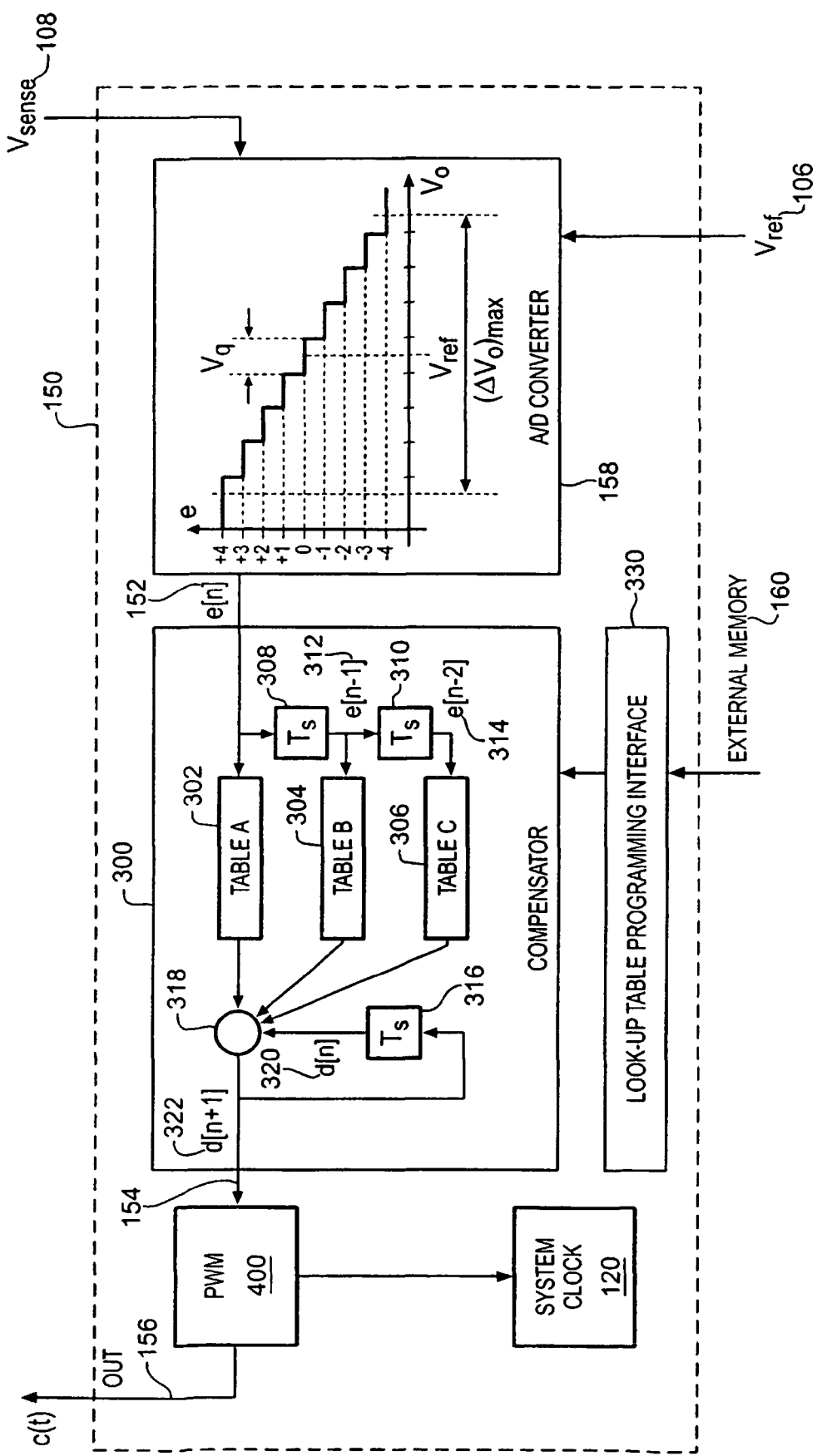
FIG. 3 is a block diagram of the operation of the digital voltage controller of FIG. 1.

FIG. 3 is a block diagram of the operation of digital voltage controller 150 of FIG. 1. In the embodiment of FIG. 3, the digital representation of error signal 152 assumes one of nine values, from −4 to +4 (decimal). Although ADC 158 preferably has sufficiently fine resolution to accurately regulate Vo 104, only a few bits are needed to represent digital error signal e(n) 152. In the preferred embodiment, the value of digital error signal 152 is used as a lookup table address. Thus, any arbitrary association may be established between the magnitude of digital error signal 152 and the magnitude of the numerical entries located at the lookup table address pointed to by the digital error signal 152 value. Table 1, located later in this document, identifies a preferred embodiment correlation between digital error signal values and the magnitude of the control signal desired. Herein, the "digital error magnitude" is a value that corresponds to the magnitude of the disparity between the measured voltages. Preferably, a digital error signal corresponds to the lookup table address at which its digital error magnitude is located.

A novel delay line ADC configuration 700 that takes advantage of the required static A/D characteristic and which lends itself to a simple digital implementation is described in connection with FIG. 7. It will be appreciated that delay line ADC 700 is the preferred although not the only available embodiment of ADC 158.

In addition to relaxing the requirements for ADC 158, the ability to represent error signal 152 with a limited number of bits enables a simplified implementation of the next controller component—compensator 300. Preferably, compensator 300 uses the value of digital error signal 152, optionally along with stored values of signal 152 from previous cycles, to calculate a digital control signal 154, which in the preferred embodiment, is a digitally expressed duty ratio of a constant frequency signal.

The computation within compensator 300 may be established in accordance with established digital control theory. However, standard implementation of linear control laws in compensator 300 would generally involve the use of digital adder(s) and/or digital multiplier(s), which devices increase the size of controller 150 and which tend to increase the clock frequency requirements for controller 150. To beneficially exploit the fact that only a small number of bits are needed to represent digital error signal 152, the preferred embodiment of compensator 300 instead calculates duty ratio 154 using look-up tables 302, 304, and 306 and adder 318. Preferably, the current and the previous values of digital error signal 152 serve as address(es) from which values may be obtained in lookup tables 302, 304, and 306. Since digital error signal 152 preferably assumes only a small number of values, the number of entries in the lookup tables 302, 304, and 306 is correspondingly small. Consequently, the implementation of tables 302, 304, and 306 requires only minimal real estate on a chip. Moreover, the calculation of duty ratio 154 can preferably be accomplished in a small number of system clock 120 cycles. Although the discussion of FIG. 3 is directed to an embodiment including three lookup tables and one adder, it will be appreciated that more than one adder could be employed and that fewer or more than three lookup tables could be employed.

Preferably, compensator 300 can be programmed to perform different control algorithms by adjusting the values of entries in lookup tables 302, 304, and 306. One control algorithm supported in the embodiment of FIG. 3 is described as follows:

(1) $d(n+1)=d(n)+\alpha(e(n))+\beta(e(n-1))+\gamma(e(n-2))$, where $\alpha(\cdot)$, $\beta(\cdot)$ and $\gamma(\cdot)$ may be either linear or nonlinear functions of digital error signal 152. However, a variety of control algorithms can be implemented. One additional example is described by:

(2) $d(n+1)=d(n)+ae(n)+be(n-1)+ce(n-2)$, where a, b, and c are constants and corresponds to a basic PID (proportional, integral, and derivative) control algorithm. In the design of controller 150, once the coefficients a, b and c are selected (to achieve a desired closed-loop bandwidth and adequate phase margin, for example), the products a·e, b·e, and c·e are preferably pre-computed for all possible values of the error "e" and preferably programmed into lookup tables 302, 304, and 306 from external memory 160. As an alternative to using external memory 160, lookup tables 302, 304, and 306 could be preprogrammed and hard-wired on the chip at design time, or programmed from other system components via a suitable interface at run time. Thus, external memory 160 is one beneficial approach to supplying data to lookup tables 302, 304, and 306, but alternatives approaches, as discussed above, are available.

The programmability of compensator 300 preferably enables the same controller 150 hardware to be used with different power-stage configurations and different power-stage parameters by modifying data entries to lookup tables 302, 304, and 306 rather than by making hardware changes. Moreover, compensator 300 preferably enables experimentation with various nonlinear control algorithms without requiring the labor-intensive, time-consuming, and inconvenient replacement of precise analog components.

Figure 4:
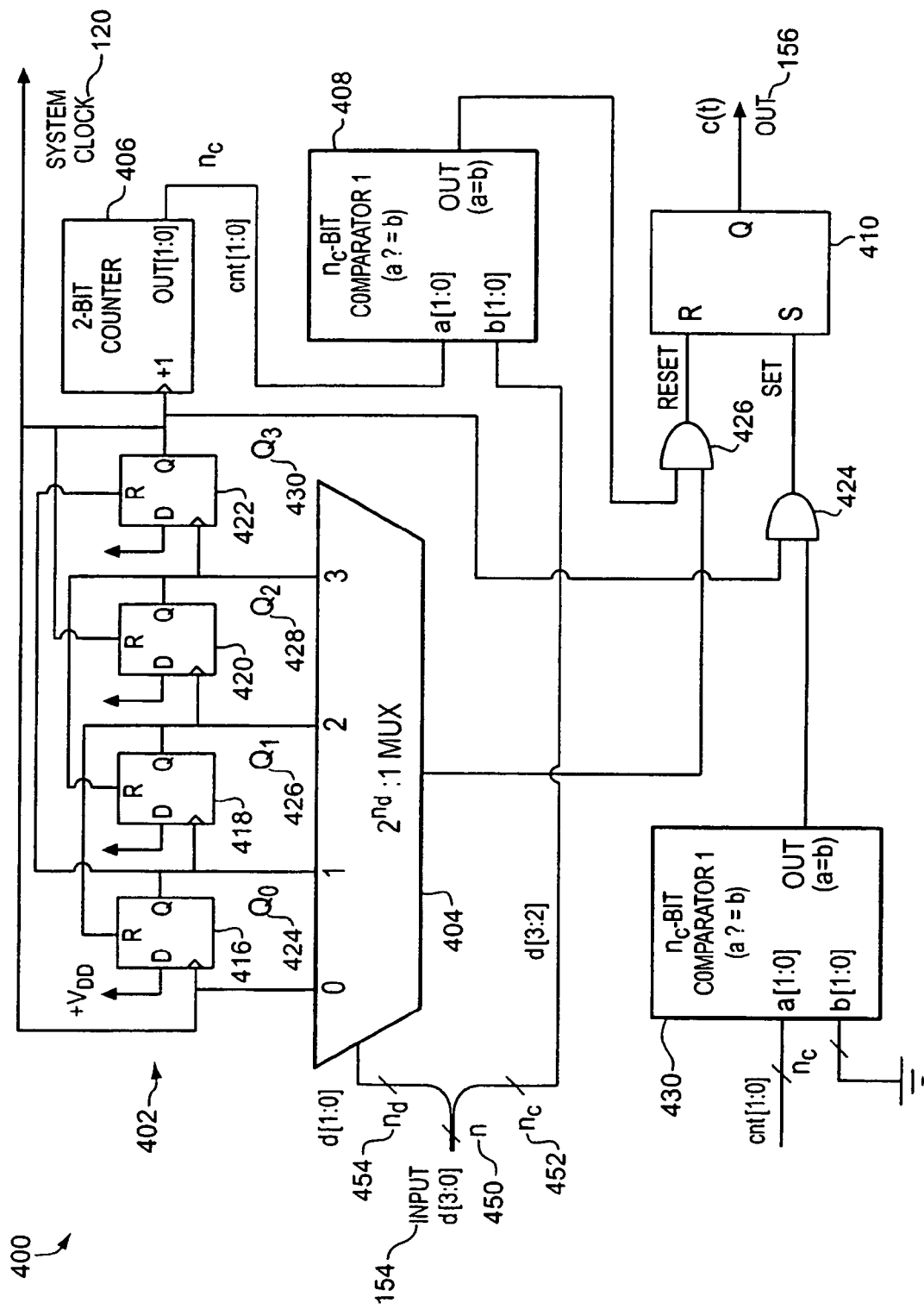
FIG. 4 is a block diagram of the pulse width modulator included in the digital voltage controller of FIG. 1.
Figure 5:
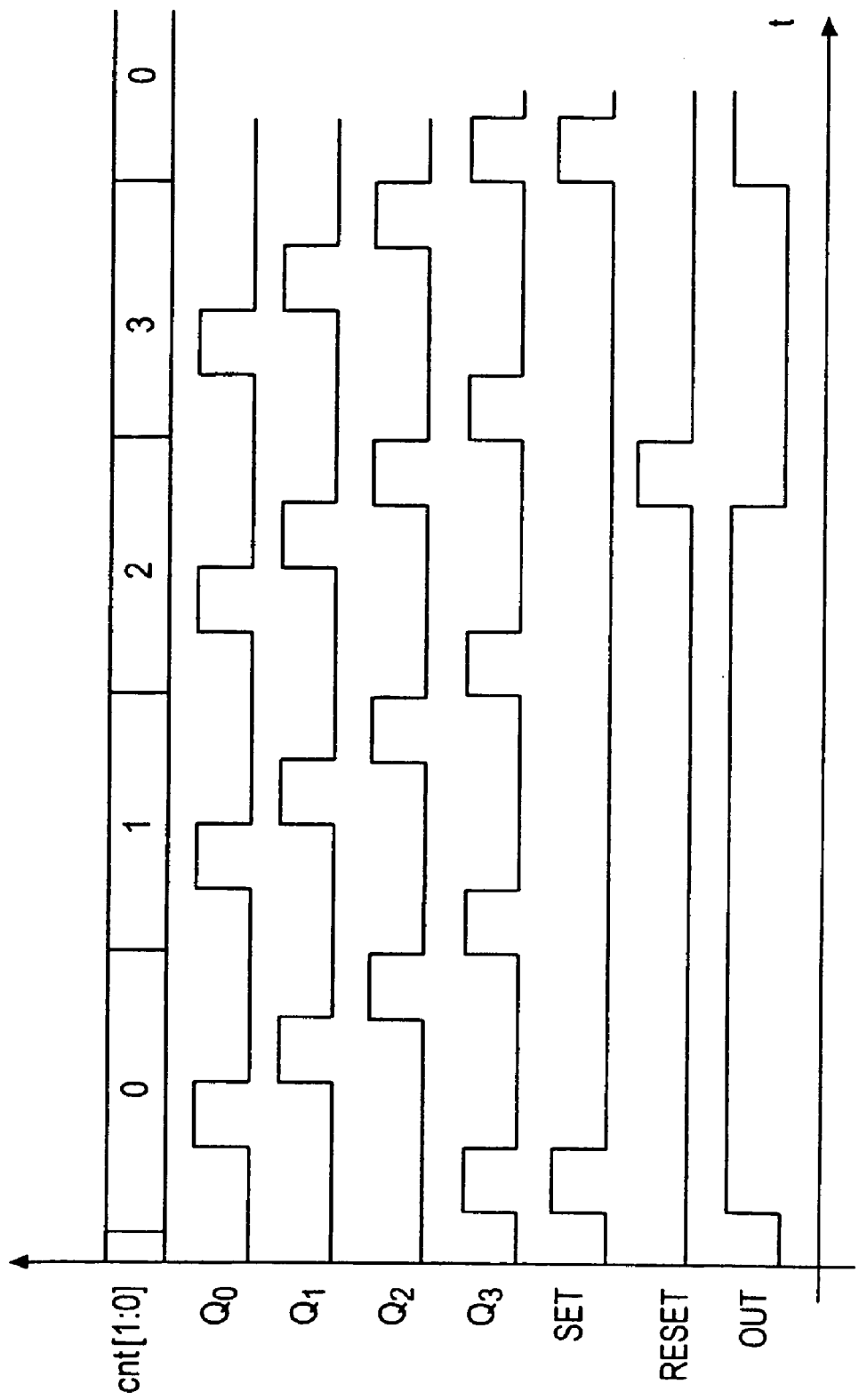
FIG. 5 is a plot of waveforms of signal values of the pulse width modulator of FIG. 4.

FIG. 4 is a block diagram of pulse width modulator 400 included in the digital voltage controller of FIG. 1. FIG. 5 is a plot of waveforms of various signal values of the pulse width modulator of FIG. 4. Pulse width modulator (PWM) 400, which is preferably a hybrid digital PWM, preferably completes the controller architecture. PWM 400 preferably produces the periodic waveform c(t) 156 from duty ratio 154 and preferably controls transistor switches 202 and 208 in power converter 200 therewith. Preferably, PWM 400 may be beneficially employed to achieve high switching frequency operation and control of Vo 104 within a small, defined range.

PWM 400 preferably operates as a D/A converter (DAC) in voltage regulator 100. Generally, the PWM 400 resolution determines the available set of output voltage 104 values. If the PWM 400 resolution is not sufficiently high, an undesirable limit-cycle oscillation in the value of Vo 104 can result. If none of the achievable output voltages 104 fall into the range of $\Delta V_o$ around $V_{ref}$ 106, duty ratio 154 will generally oscillate between two or more values. Avoidance of this limit-cycle operation may be achieved by ensuring that the output voltage increment that corresponds to the least-significant bit of duty ratio 154 is smaller than $\Delta V_o$. This condition has been evaluated as a function of the steady state input and output voltages for different converter configurations.

A high-resolution, high-frequency digital pulse-width modulator (DPWM) can be constructed using a fast-clocked counter and a digital comparator. To achieve n-bit resolution at the switching frequency $f_s$, the desired clock frequency is $2^n f_s$. This desired clock frequency generally leads to more demanding timing constraints and increased power consumption. For example, an 8-bit resolution at the switching frequency of $f_s=1$ MHz would require a clock frequency of 256 MHz. It has been shown that fine time resolution and much lower power consumption can be achieved using a tapped delay-line scheme similar to a ring oscillator that operates at the switching frequency. However, this implementation requires a larger-area digital multiplexer. The PWM architecture selected for use in the preferred embodiment is based on a hybrid delay-line/counter approach. In this approach, n-bit resolution is achieved using an $n_c$-bit counter (where $n_c<n$), whereas the remaining $n_d=n-n_c$ bits of resolution are obtained from a tapped delay line.

The embodiment of FIG. 4 is a PWM 400 where 4-bit (n=4) resolution is obtained using 2-bit counter ($n_c=2$) 406 and a 4-cell ring oscillator ($n_d=2$, $2^{n_d}=4$) 402 which includes flip-flops 416, 418, 420, and 422 operating as delay cells. Preferably, at the beginning of a switching cycle, output SR flip-flop 410 is set, and the PWM 400 output pulse c(t) 156 goes high. Preferably, a pulse propagates through oscillator 402 at a frequency of $2^{n_c} f_s=4f_s$ which pulse serves as the clock pulse for the counter 406. The switching period is preferably divided into $2^{n_d} 2^{n_c}=16$ slots. Preferably, when counter 406 output matches the top $n_c$ 452 most significant bits of digital input 154 and a pulse reaches the tap selected by the $n_d$ 454 least significant bits of digital input 154, output flip-flop 410 is reset, and the output pulse goes low.

It will be appreciated that resolution employing any number of bits n 450 may be employed, including a wide range of values for $n_c$ 452 and $n_d$ 454 may be employed. Preferably, a "pulse-on" period during which output pulse 156 (power command signal) is on corresponds to the value of digital input 154. This "pulse-on" duration is preferably the product of the duty ratio, expressed by digital input 154, and the switching period (reciprocal of $f_s$, the switching period). In order to avoid the very high clock frequencies needed to accurately establish the pulse-on period with high resolution using only a counter and comparator, the pulse-on period is preferably established by separately establishing two separate components of the pulse-on period. For a given switching period, determination of the first and second components of the pulse-on period for output signal 156 effectively determines the first and second components of the duty ratio for output signal 156.

In the preferred embodiment, a first component, or first portion, of the pulse-on period is preferably established using a selection $n_c$ 452 of the highest ordered bits of digital input 154. Counter 406 preferably counts to a value equal to "2" raised to the power $n_c$ 452 at clock frequency 120. A second component, or second portion, of the pulse-on period is preferably established using the $n_d$ 454 lowest ordered bits of the original n 450 bits of digital input 154. The second component of the pulse-on period is preferably established using a delay line 402 having a specified number of flip-flops. The number of flip-flops used is preferably equal to 2 raised to the power $n_d$ 454. Preferably, the magnitude of the digital value of the sequence of $n_d$ 454 bits determines the number of flip-flop delays which form the second component of the pulse-on period. This hybrid (combination of counter and delay line) approach preferably avoids the need for an extremely high frequency for counter 406 while still maintaining high accuracy for the resulting pulse-on period during which output signal c(t) 156 is high.

In the exemplary waveforms of FIG. 5, the duty ratio of the output pulse is 11/16. The basic delay cell in ring oscillator 402 of FIG. 4 consists of a single resettable flip-flop. Preferably, the delay of each of cells 416, 418, 420, and 422 and the number of cells in ring 402 determine the switching frequency $f_s$. To adjust the switching frequency, any cell of cells 416, 418, 420 and 422 can be modified by inserting additional delay elements between the output of a cell and the input to a succeeding cell. The additional delay elements can be standard logic gates, or gates with adjustable delay, if switching frequency tuning or synchronization with an external clock are desired.

Figure 6:
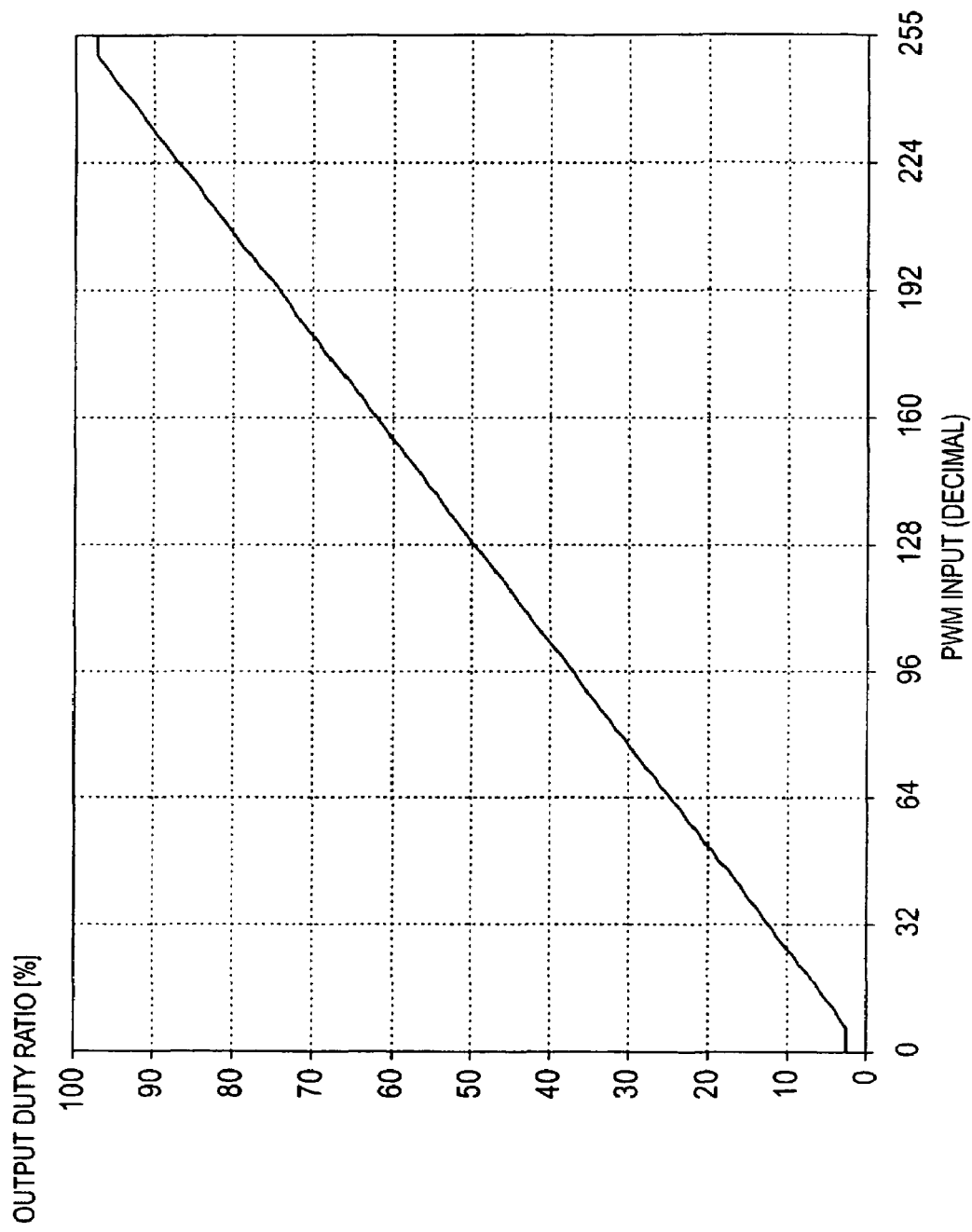
FIG. 6 is a plot of duty ratio output as a function of digital input for the pulse width modulator of FIG. 4.

The self-oscillating DPWM (digital pulse width modulator) embodiment shown in FIG. 4 has several desirable properties including a simple HDL description, an even number of time slots in a period, an ability to stop and restart the oscillations on command (by gating the propagation of the signal through the ring), and relatively small size. An experimental prototype chip was designed in which the DPWM had 8-bit resolution (n=8) using a 3-bit counter ($n_c=3$) and a 32-cell long ring ($n_d=5$). PWM 400 preferably operates at a switching frequency of $f_s=1$ MHz. The ring preferably oscillates at $2^{n_c} f_s=8$ MHz. This 8 MHz signal is preferably used as the system clock for the entire chip. Experimental results for PWM 400, depicted in FIG. 6, show the measured duty ratio of the output pulses as a function of 8-bit digital input 154. The minimum (3.1%) duty ratio and the maximum (97.3%) duty ratio are preferably established during a design phase.

Generally, static and dynamic output voltage regulation capabilities depend on the characteristics of the A/D converter employed. Conventional, high-speed, high-resolution A/D converters consume power and chip area, and require precision analog components. Also, in a switching power supply, the sensed analog voltage signal is provided by a switching power converter. This signal generally has a lot of switching noise, which can be a problem for many conventional A/D converters such as the basic flash configuration. Accordingly, the inventors sought an alternative ADC embodiment, which is described below in connection with FIG. 7.

Figure 7:
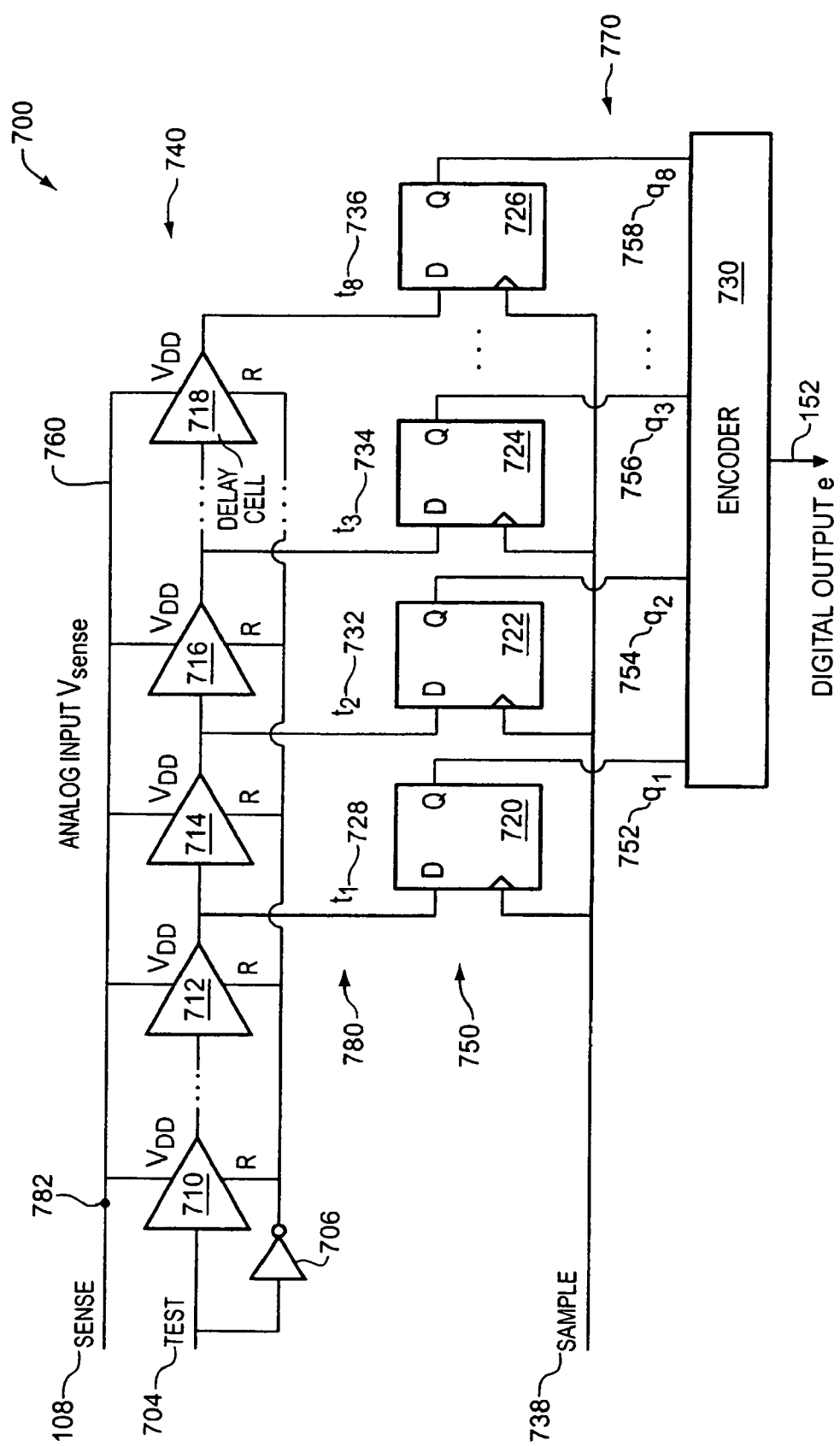
FIG. 7 is a block diagram of the delay line ADC included in the voltage controller of FIG. 1.
Figure 8:
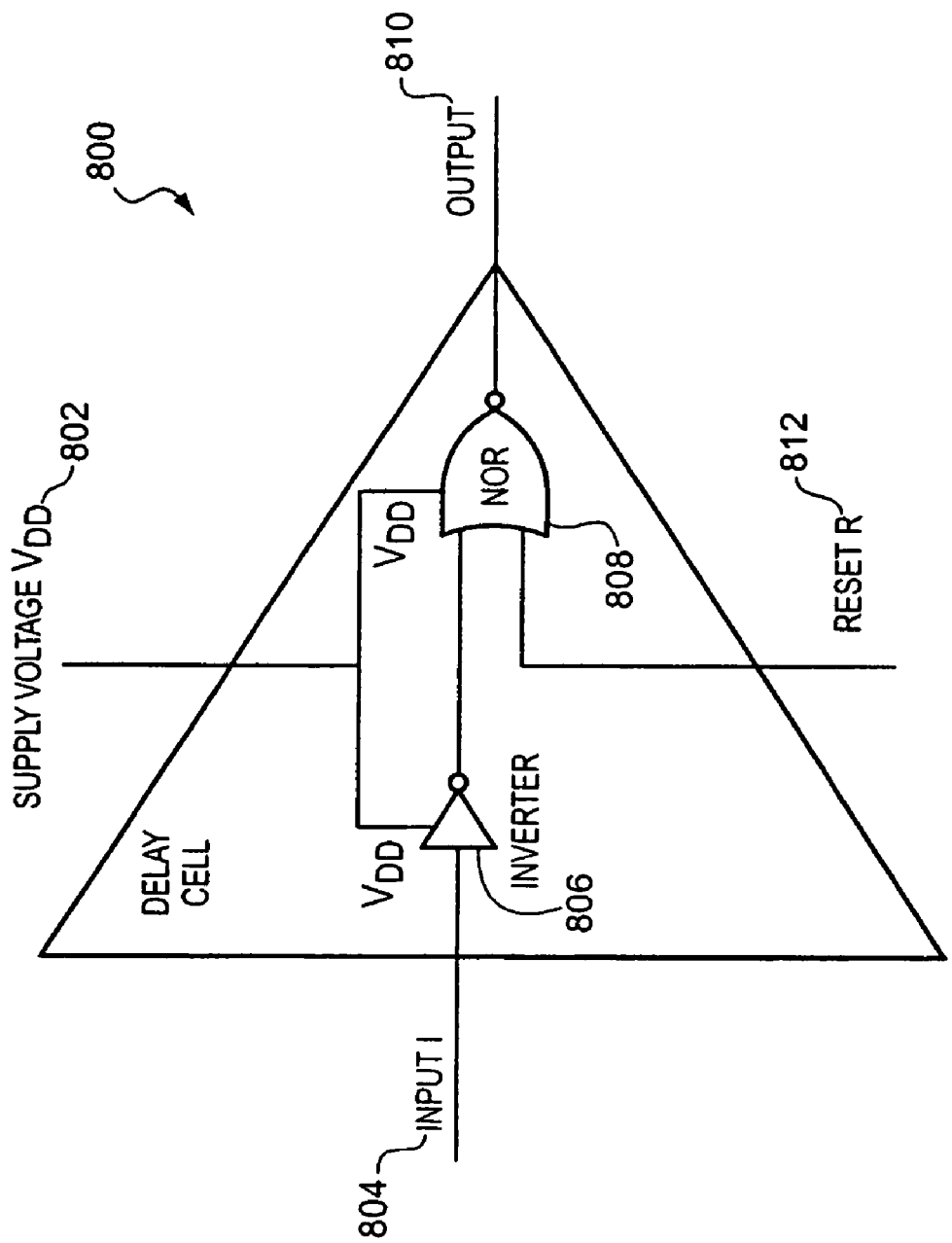
FIG. 8 is a schematic diagram of a delay cell ADC corresponding to the delay cells included in the delay line of FIG. 7.
Figure 9:
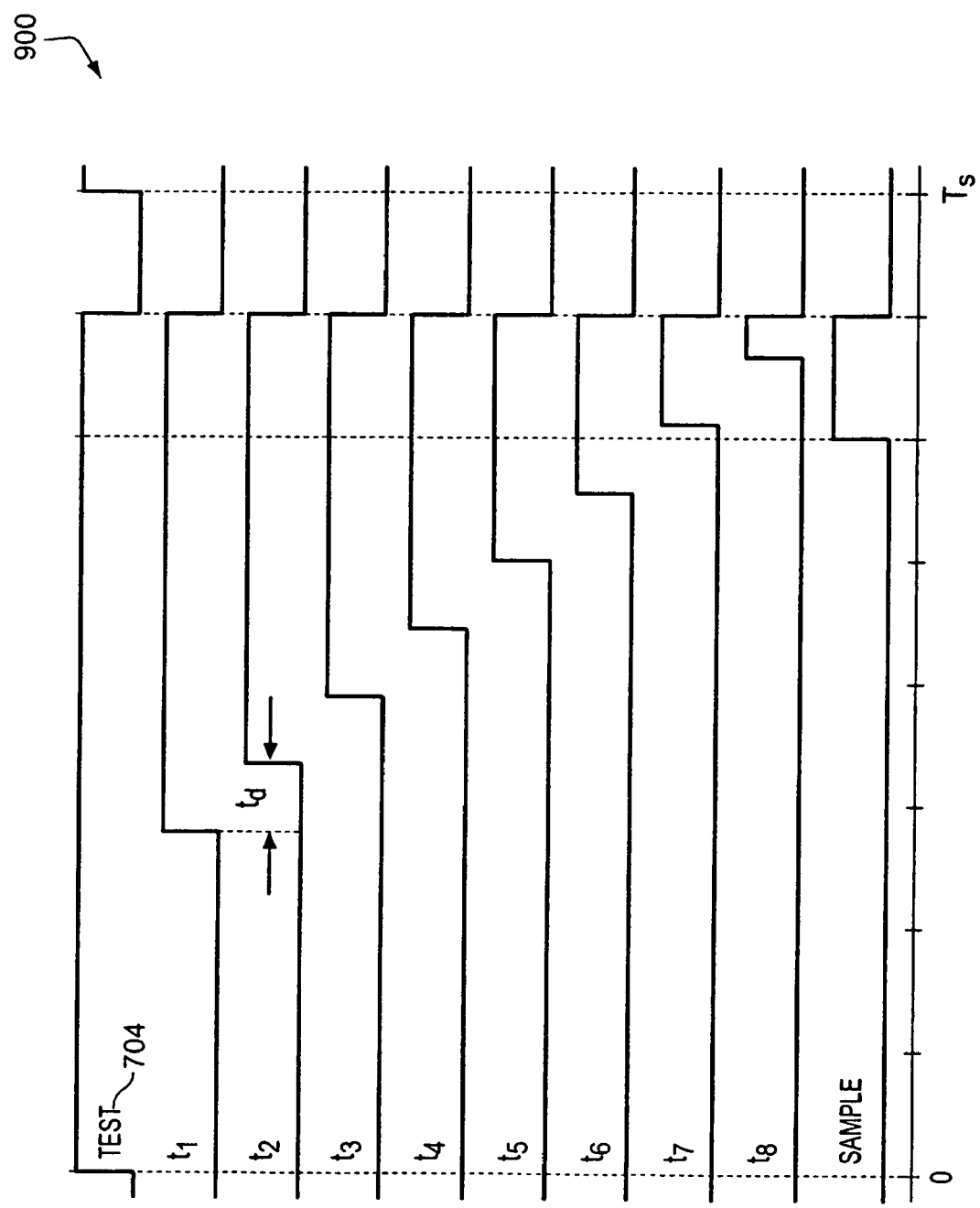
FIG. 9 is a plot of timing waveforms for tap signals of the delay line ADC of FIG. 7.

FIG. 7 is a block diagram of delay line ADC 700 preferably forming part of voltage controller 150 of FIG. 1. FIG. 8 is a schematic diagram of delay cell ADC 800 corresponding to the delay cells 710, 712, 714, 716, and 718 included in the delay line ADC 700 of FIG. 7. Timing waveforms embodiment of delay-line ADC 700 embodiment of FIG. 7 are shown in FIG. 9. In this disclosure, the designation "delay cell 800" will be used when referring to a delay cell in general. Where a particular delay cell is indicated, the reference numeral designating that delay cell will be employed. Preferably, each delay cell 800 has an input 804, an output 810, and a reset input R 812. Preferably, when reset input 812 is active high, cell output 810 is reset to zero. In the preferred embodiment, an array 740 of delay cells (preferably comprising logic gates) 800 receives sensed analog voltage 108. Thus, $V_{sense}$ 108=$V_{DD}$ for each cell in array 740.

The preferred embodiment of delay-line ADC 700 converter is based on the principle that the propagation delay of a CMOS-type (complementary metal oxide semiconductor) logic gate increases if the gate supply voltage is reduced. To the first order, the propagation delay $t_d$ of a signal through a CMOS logic gate as a function of the supply voltage $V_{DD}$ is given by:

$$t_d = K \frac{V_{DD}}{(V_{DD} - V_{th})^2}, \quad (3)$$

where $V_{th}$ is the CMOS device threshold voltage, and K is a constant that depends on the device/process parameters, and the capacitive loading of the gate. Clearly, increasing $V_{DD}$ results in shorter propagation delay. For supply voltages higher than the threshold $V_{th}$, the delay is approximately inversely proportional to $V_{DD}$.

To perform a conversion, at the beginning of a switching cycle, test signal 704 is propagated through cell array 740. After a fixed conversion-time interval, which is preferably equal to (6/8)$T_s$ in the example waveforms of FIG. 9, taps $t_1$ 728 to $t_8$ 736 are preferably sampled by "sample" signal 738 which is preferably the clock pulse for the series 750 of D-type flip-flops 720, 722, 724, and 726. The result at flip-flop outputs $q_1$ 752 to $q_8$ 758 is preferably communicated to digital encoder 730 to produce digital error signal 152. Preferably, the last portion of the switching cycle is used to reset all cells in delay line 700, to prepare for the next conversion cycle.

As $V_{sense}$ 108 increases, cell delay $t_d$ decreases, and test pulse 704 propagates further within cell array 740. Conversely, As $V_{sense}$ 108 decreases, cell delay $t_d$ increases, and test pulse 704 propagates to fewer cells 800 within cell array 740. The sampled tap outputs ($q_1$ to $q_8$) give the A/D conversion result in "thermometer" digital code. For example, for the case illustrated by the waveforms 900 of FIG. 9, the test pulse propagates to the taps $t_1$ through $t_6$, but not to the taps $t_7$ and $t_8$, such that the sequence 770 of flip-flop digital outputs ($q_1$, $q_2$, , $q_8$) equals: 11111100.

Ideally, $V_{sense}$ 108 equals $V_{ref}$ 106, and test pulse 704 propagates to the first half 760 of the tapped delay cells. In the embodiment of FIG. 7, this zero-error case corresponds to the flip-flop outputs equaling ($q_1$, $q_2$, $q_3$, $q_4$, $q_5$, $q_6$, $q_7$, $q_8$)=11110000. Preferably, encoder 730 converts the sequence of flip-flop outputs 770 into digital information encoded in a more useful form. In the preferred embodiment, this more useful form is digital error signal 152.

In the preferred embodiment, digital error signal 152 provides a value indicative of the difference, or error, between $V_{sense}$ 108 and $V_{ref}$ 106. The desired steady state operation of the power supply corresponds to a digital error signal 152 value of zero. Preferably, encoder 730 provides a digital error signal 152 having a digital value, the magnitude of which is proportional to the analog voltage difference between $V_{sense}$ 108 and $V_{ref}$ 106. Table 1 and the discussion below expand on the function of encoder 730. The "digital error magnitude" was discussed earlier in this disclosure. For the sake of consistency of terminology, the term "digital error magnitude" is included in Table 1. However, the entries in the table are expressed in decimal form for convenience.

TABLE 1

Delay line specifications.

| Vsense Range | Thermometer Code | Digital Error Magnitude | Encoder 730 output |
|---|---|---|---|
| Vsense < 2.38 | 11111111 | +4 | 0000 |
| 2.38 <= Vsense < 2.42 | 01111111 | +3 | 0001 |
| 2.42 <= Vsense < 2.46 | 00111111 | +2 | 0010 |
| 2.46 <= Vsense < 2.50 | 00011111 | +1 | 0011 |
| 2.50 <= Vsense < 2.54 | 00001111 | 0 | 0100 |
| 2.54 <= Vsense < 2.58 | 00000111 | −1 | 0101 |
| 2.58 <= Vsense < 2.62 | 00000011 | −2 | 0110 |
| 2.62 <= Vsense < 2.66 | 00000001 | −3 | 0111 |
| 2.66 <= Vsense | 00000000 | −4 | 1000 |

Figure 14:
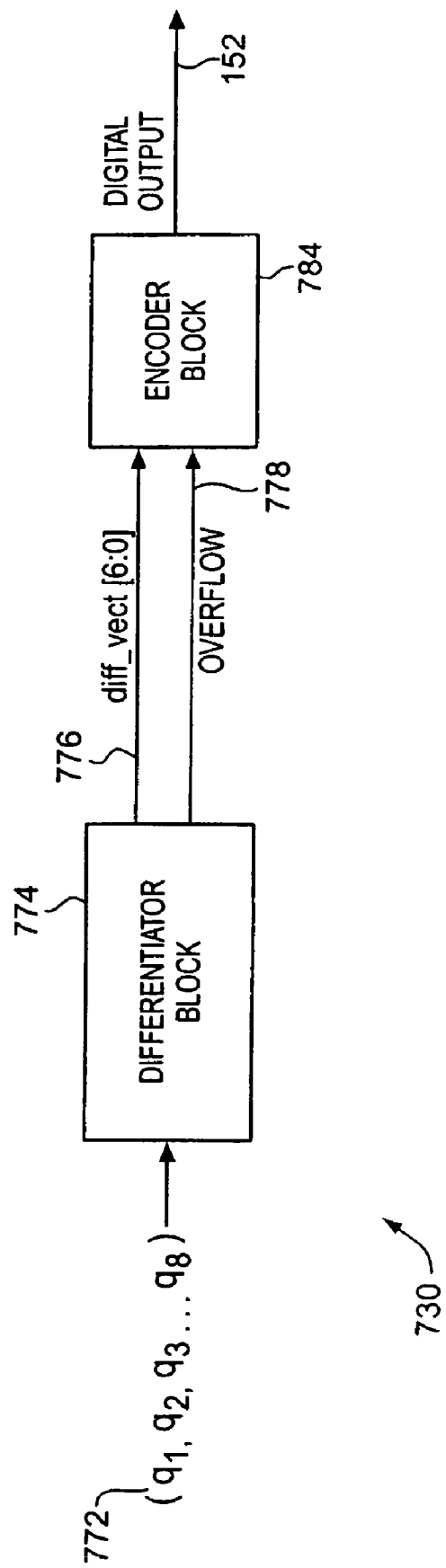
FIG. 14 is a block diagram of the function of encoder 730 included in the delay line ADC 700 of FIG. 7.

FIG. 14 is a block diagram of the function of converter 730 included in the delay line ADC 700 of FIG. 7. In the preferred embodiment, encoder 730 accepts the delay line ADC 700 thermometer code 772 as input and outputs encoded digital output 152. Thermometer code 772 is the sequence of digital values included in sequence 770 of flip-flop outputs. Thermometer code is preferably directed to differentiator block 774 which differential vector 776 and overflow indicator 778 to encoder block 784. Encoder block thereafter provides digital output 152.

The second and third columns of Table 1 specify the input to and output from encoder 730. Since this is a simple binary translation from one encoding scheme to another, the encoder can be implemented using behavioral HDL and synthesis techniques. However, other conversion mechanisms may be employed. It will be appreciated that the data in table 1 is exemplary. Different voltage ranges of Vsense may be associated with the digital values in columns 2 and 3 for one or more of the entries in table 1.

In the preferred embodiment of delay line ADC 700, the length of the delay cell array 740 effectively determines the reference voltage value around which the analog to digital conversion characteristic is centered. The number of cells 800 and the delay of each cell 800 preferably determine the range $(\Delta V_o)_{max}$ and the effective LSB voltage resolution of the delay line ADC 700. In an experimental prototype chip, the delay-line length and the cell delay were designed (by simulation) to have values $V_{ref} \approx 2.5V$, and $\Delta V_o \approx 40$ mV. Eight cells 800, each with associated taps, preferably provide an A/D voltage conversion range $(\Delta V_o)_{max}=(8+1)\Delta V_o \approx 360$ mV.

Some advantages of the preferred delay-line ADC 700 are that its basic configuration does not require any precision analog components and that it can be implemented using standard digital logic gates. Therefore, delay line ADC 700 scales well and can be based on an HDL description. When using delay line ADC 700, sampling at high switching frequencies (in the range from hundreds of KHz to several MHz) can be readily accomplished using integrated circuits made using modern sub-micron CMOS processes. Moreover, the preferred embodiment of delay line ADC 700 has built-in noise immunity, which noise immunity arises from the fact that the sampling can extend over a large portion of the switching period over which the input analog signal $V_{sense}$ 108 is effectively averaged. Therefore, digital output 152 is preferably not affected by sharp noise spikes in the output voltage 104 of power converter 200.

Figure 10:
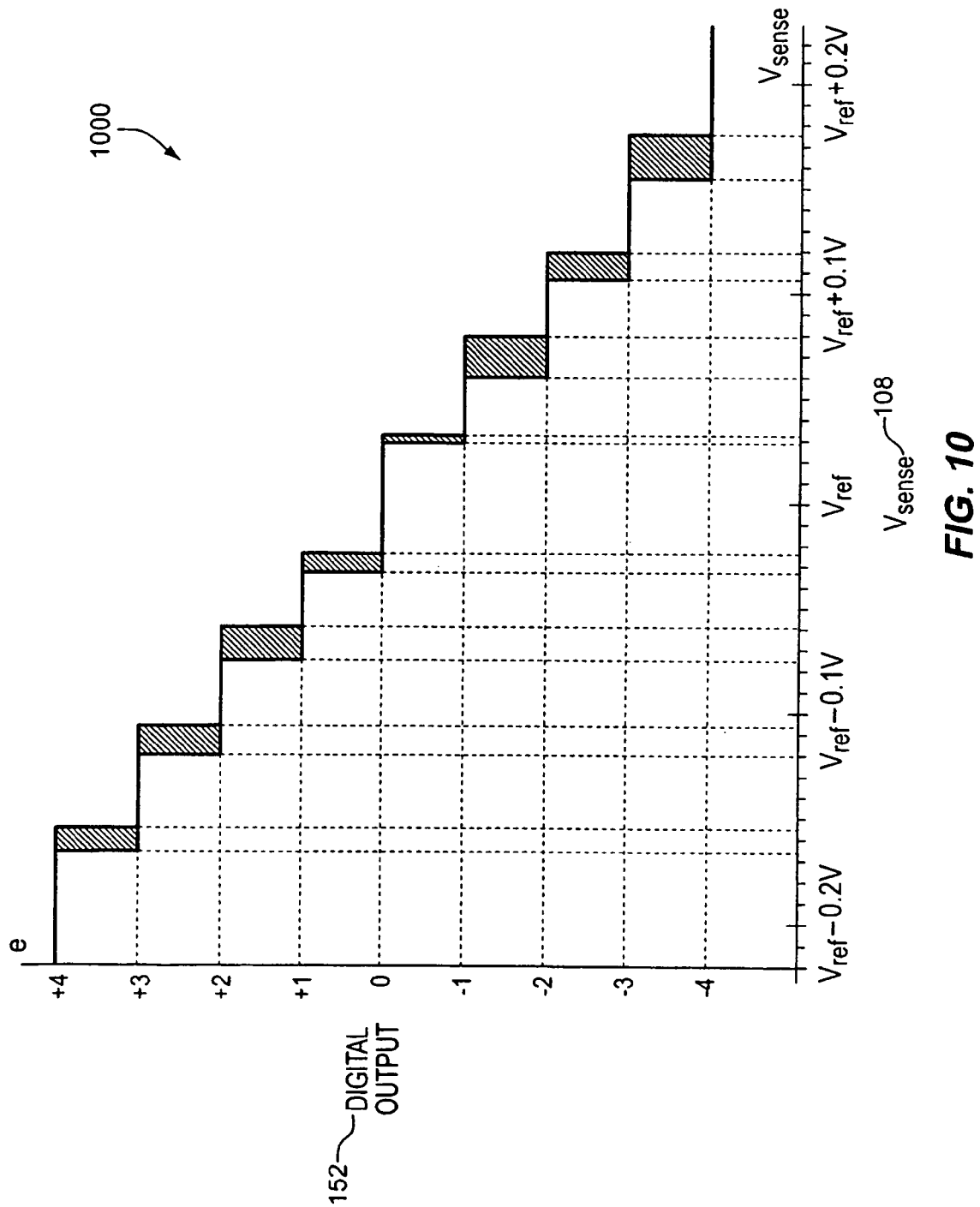
FIG. 10 is a plot of the conversion characteristic of the delay line ADC of FIG. 7.

The conversion characteristic 1000 measured for a prototype version delay line ADC 700 is shown in FIG. 10. The shaded portions of the characteristic (plot) 1000 indicate voltages for which digital output code 152 may assume one of two consecutive values. Characteristic 1000 exhibits some non-linearity but is monotonic. And, the widths of the code "bins" are approximately equal to the desired $\Delta V_o$ value. In a voltage regulator application, the A/D imperfections (code-flipping and non-linearity) have very little effect on the closed-loop operation. During steady state operation, output voltage 104 preferably converges on a voltage corresponding to a digital error signal 152 value of zero. On a set of 10 prototype chips, the inventors found the average of the zero-error bin width to be equal to 53 mV, with a standard deviation of 3.6 mV. The measured reference voltage was $V_{ref}$=2.7 V, while the measured current consumption of the delay line ADC 700 was about 10 µA.

The basic delay-line ADC 700 results in a reference voltage $V_{ref}$ 106 that is indirectly determined by the length of the delay line 700 and by the delay-versus-voltage characteristic of each delay cell 800. In practice, because of process and temperature variations, the reference value obtained by the basic delay-line A/D configuration is difficult to precisely control. Variation of the effective $V_{ref}$ 106 causes variation in the regulated output voltage 104, and this variation could cause regulator 100 to perform sub-optimally. Accordingly, delay line ADC 700 is preferably calibrated prior to being implemented in an operating voltage regulator 100. Otherwise stated, the extent of delay in delay line ADC 700 is preferably correlated with known voltage values. This established correlation is preferably employed during later operation of controller 150 to reliably associate an extent of test pulse 704 signal propagation delay along delay cell array 740 with a particular voltage.

Figure 11:
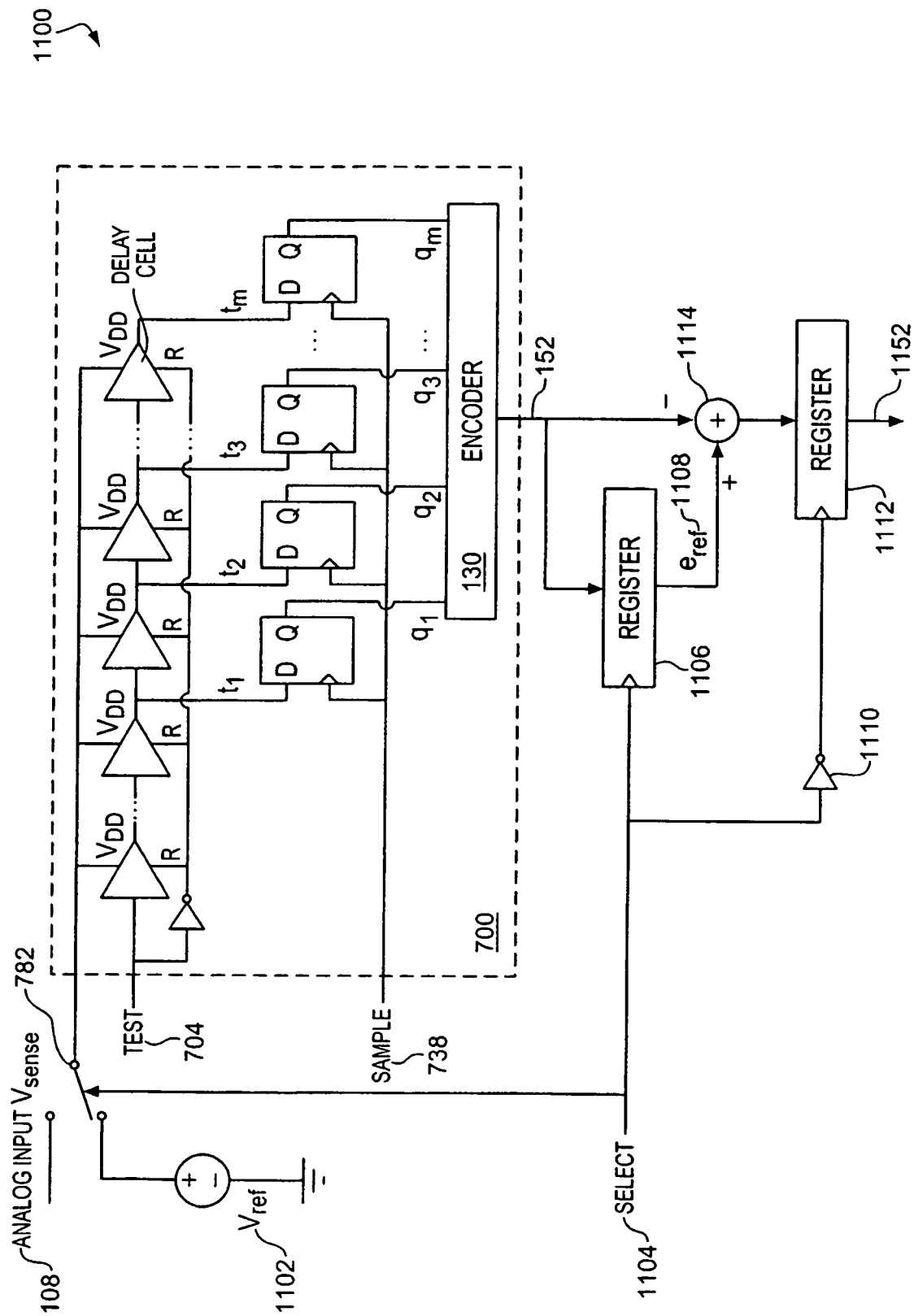
FIG. 11 is a block diagram of a preferred digital calibration scheme for the delay line ADC of FIG. 7.
Figure 12:
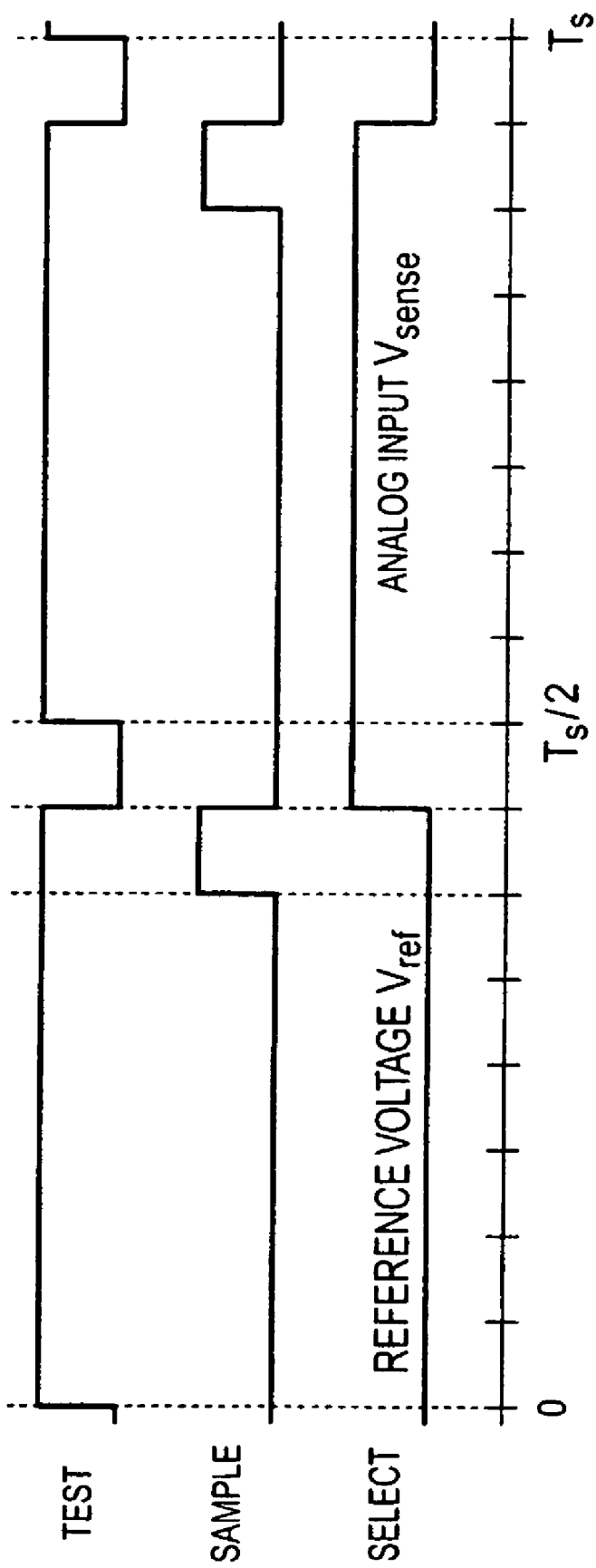
FIG. 12 is a plot of timing waveforms of the calibration scheme of FIG. 11.

FIG. 11 is a block diagram of a preferred digital calibration scheme 1100 for delay line ADC 700 of FIG. 7; and FIG. 12 is a plot of timing waveforms of the calibration scheme 1100 of FIG. 11. A preferred calibration approach involves applying a stable, precise reference calibration reference voltage 1102, preferably generated using standard bandgap techniques, to the input 782 of delay line ADC 700 and to digitally subtract the conversion result from the digital output 152 value obtained when the actual analog input voltage $V_{sense}$ 106 is applied. Calibration reference voltage 1102 may, but need not, be the same as reference voltage 106 discussed in connection with FIGS. 1, 3, and 7.

In the preferred embodiment, two conversions are performed in each switching period. In one half of the switching period, the calibration reference voltage $V_{ref}$ 1102 is preferably applied to delay line ADC 700. The result of the reference conversion $e_{ref}$ 1108 ideally 0, but the actual value can have finite magnitude because of process and temperature variations. Reference conversion error value $e_{ref}$ 1108 is preferably stored in register 1106. In the second part of the period, $V_{sense}$ 108 is preferably applied to delay line ADC 700. Preferably, delay line ADC 200 provides an un-calibrated digital output 152, as described in connection with FIG. 7, corresponding to the analog voltage value of $V_{sense}$ 108. Thereafter, un-calibrated output 152 is preferably subtracted from $e_{ref}$ 1108 to obtain calibrated digital output 1152. In the preferred embodiment, where calibration is employed, calibrated digital output 1152 is used instead of uncalibrated digital output 152, thereby providing greater accuracy for correction of output voltage $V_o$ 104. Herein, the terms "calibrated digital output", "corrected digital output", "calibrated digital error signal", and "corrected digital error signal" are used interchangeably.

The generation of the reference conversion error value 1108 may, but need not, be conducted in each switching period. An appropriate frequency of reference conversion may be selected based on the characteristics of a particular voltage controller 150. Separately, other calibration schemes may be implemented in conjunction with the present invention including but not limited to schemes based on delay-locked loop (DLL) principles.

Controller 150, described herein, was designed and implemented in a standard 0.5µ (micron) CMOS process. The chip design was described using HDL. Synthesis and timing verification tools were used to reduce the design to standard cell gates. A preferred embodiment of delay line ADC 700 occupies less than 0.2 mm² (square millimeters). The total active chip area for controller 150 is preferably less than 1 mm².

In the preferred embodiment, compensator 300 includes 3 tables (for e(n), e(n−1), and e(n−2)). Preferably, digital error signal 152 generated by delay line ADC 700 can have 9 possible values. In the preferred embodiment, the outputs from lookup tables 302, 304, and 306 have 8 bits, 9 bits, and 8 bits, respectively. Therefore, the total on-chip memory storage is preferably 234 bits. However, it will be appreciated, that in alternative embodiments, the number of tables in compensator 300, the number of bits in the lookup tables, the number of possible values of digital error signal 152, and the total number of bits in on-chip memory storage may be lower than or greater than the numbers of these items disclosed in the preferred embodiment described above.

In the preferred embodiment, the bit-lengths of the table entries are determined by the range of error signal 152 values (±4) and by the desired precision of pole-zero placement. Adder 318 preferably produces a 10-bit signed value which is preferably reduced to 8-bit duty ratio signal 154 by eliminating the sign bit, and by truncating the least significant bit.

To demonstrate closed-loop operation of the preferred embodiment, the controller chip was used with a synchronous buck converter as shown in FIG. 1. The input voltage $V_g$ 102 was set between 4 V and 6 V, the output voltage 104 was regulated at $V_o$=2.7V, the load current was set between 0 A and 2 A, and the switching frequency was set to 1 MHz. The filter components used had values of L 210=1 µH (micro-Henry) and C 212=100 µF (micro-Farads). Based on the standard averaged model of converter 200, compensator 300 was designed using the pole-zero matched method to achieve a loop cross-over frequency of approximately 50 KHz and a phase margin of about 50°. When converter 200 is powered up, it loads compensator 300 table entries from external memory 160 and then starts to sample output voltage 104 and to produce pulsating waveform c(t) 156.

Figure 2:
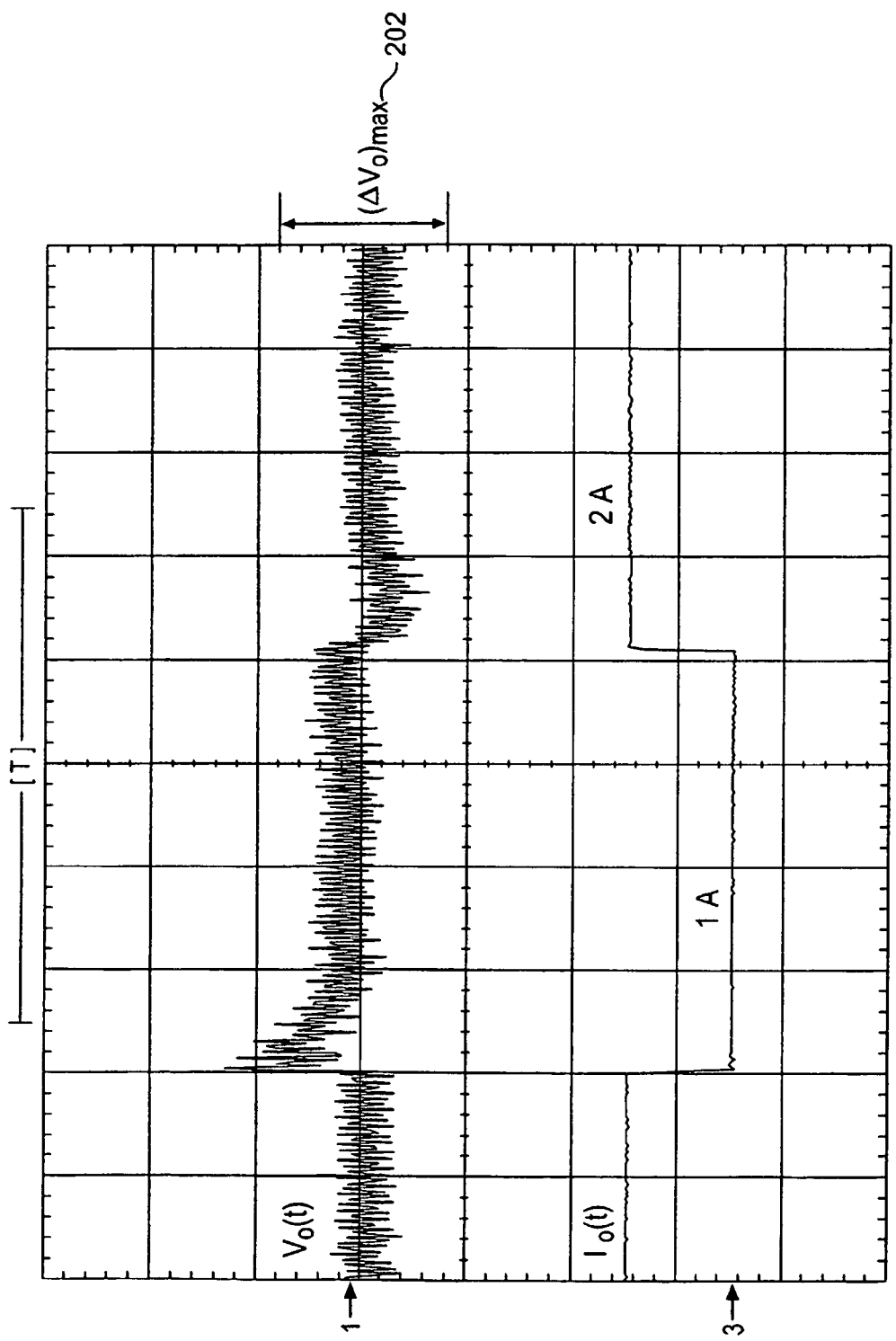
FIG. 2 is a plot of the transient response of output voltage and output current obtained with the regulator of FIG. 1.
Figure 13A:
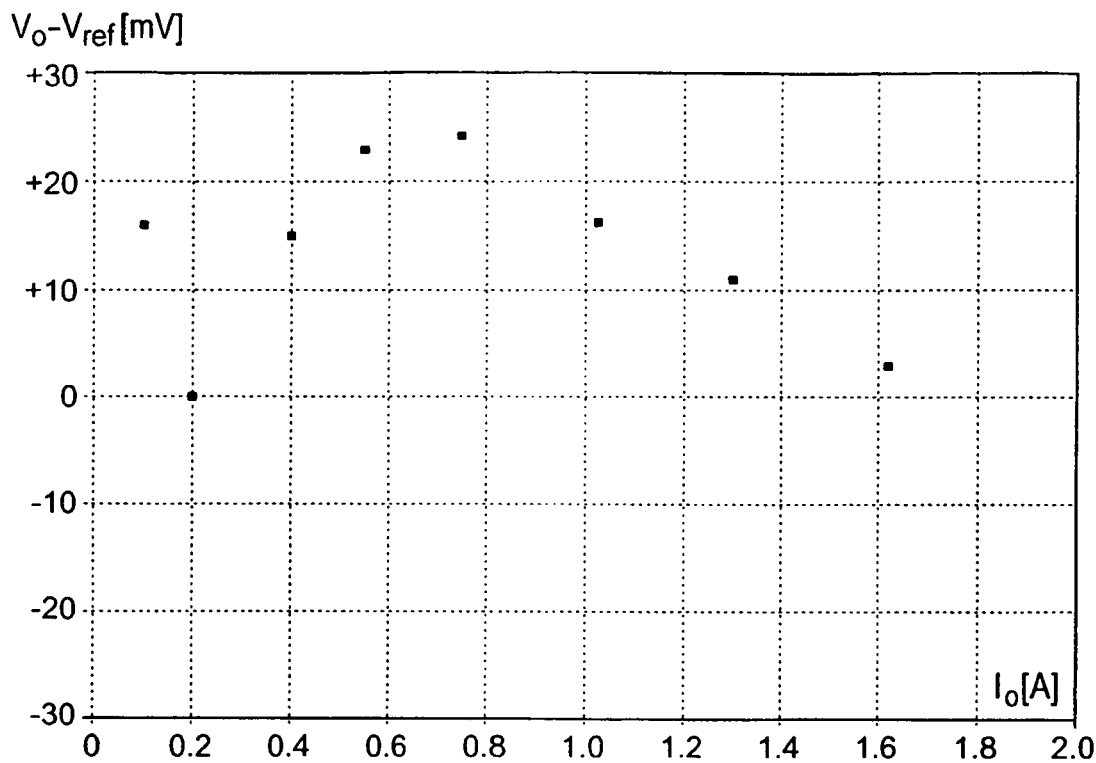
FIG. 13A is a plot of the measured load voltage regulation against load current for the voltage regulator of FIG. 1.
Figure 13B:
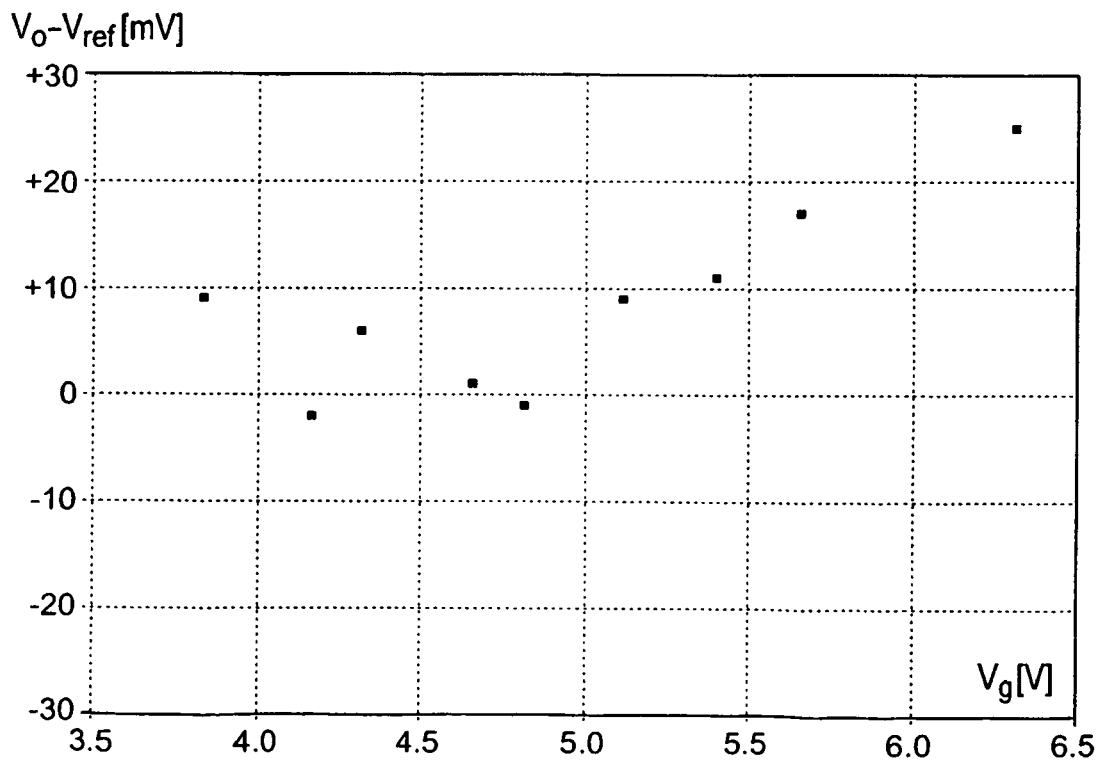
FIG. 13B is a plot of the measured load voltage regulation against supply voltage for the voltage regulator of FIG. 1.

FIG. 2 is a plot of the transient response of output voltage 104 and output current obtained with regulator 100 of FIG. 1. Experimental 50%-100% load transient waveforms are shown in FIG. 2. In the preferred embodiment, $V_o$ 104 remains within the $(\Delta V_o)_{max}$ range 202. FIG. 13A is a plot of the measured load voltage 104 against load current for voltage regulator 100 of FIG. 1. FIG. 13B is a plot of the measured load voltage 104 against supply voltage 102 for voltage regulator 100 of FIG. 1.

There has been described a novel digital voltage controller. It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiments described, without departing from the inventive concepts. It is also evident that the methods recited may in many instances be performed in a different order; or equivalent structures and processes may be substituted for the various structures and processes described. Consequently, the invention is to be construed as embracing each and every novel feature and novel combination of features present in and/or possessed by the invention herein described.

We claim:

1. A voltage controller comprising:
a compensator including a lookup table for determining a digital control signal based on a digital error signal;
a modulator operative to provide a power control signal in response to said determined digital control signal; and
a delay line analog to digital converter operative to compare a converter voltage to a reference voltage and generate said digital error signal indicative of a difference between said compared voltages;
wherein said compensator, said modulator, and said delay line of said controller include no passive electronic components.

2. The voltage controller of claim 1 wherein the delay line analog to digital converter comprises digital logic gate delay cells.

3. The voltage controller of claim 1 wherein said controller comprises no analog energy storage components.

4. The voltage controller of claim 1 wherein said controller includes no capacitors, inductors, or resistors.

5. A voltage controller comprising:
a compensator including a lookup table for determining a digital control signal based on a digital error signal;
a modulator operative to provide a power control signal in response to said determined digital control signal; and
a delay line analog to digital converter operative to compare a converter voltage to a reference voltage and generate said digital error signal indicative of a difference between said compared voltages;
wherein said controller is implemented entirely with digital logic gates.

6. The voltage controller of claim 5 wherein said digital logic gates correspond to standard library cells.

7. The voltage controller of claim 5 wherein said digital logic gates are hardware description language (HDL)-compatible.

8. The voltage controller of claim 5 wherein said controller comprises no analog energy storage components.

9. The voltage controller of claim 5 wherein said controller includes no capacitors, inductors, or resistors.

10. A voltage controller comprising:
a compensator including a lookup table for determining a digital control signal based on a digital error signal;
a modulator operative to provide a power control signal in response to said determined digital control signal; and
a delay line analog to digital converter operative to compare a converter voltage to a reference voltage and generate said digital error signal indicative of a difference between said compared voltages;
wherein all energy-storing components in said controller are digital logic gates.

11. A voltage controller comprising:
a compensator including a lookup table for determining a digital control signal based on a digital error signal;
a modulator operative to provide a power control signal in response to said determined digital control signal; and
a delay line analog to digital converter operative to compare a converter voltage to a reference voltage and generate said digital error signal indicative of a difference between said compared voltages;
wherein said delay line ADC comprises a delay cell array.

12. A voltage controller comprising:
a compensator including a lookup table for determining a digital control signal based on a thermometer code digital error signal;
a modulator operative to provide a power control signal in response to said determined digital control signal; and
a delay line analog to digital converter (ADC) operative to compare a converter voltage to a reference voltage and generate said thermometer code digital error signal indicative of a difference between said compared voltages.

13. The controller of claim 12 wherein an extent of test signal propagation through said delay line ADC establishes said thermometer code digital error signal.

14. The controller of claim 12 wherein said delay line ADC comprises an encoder operative to convert said thermometer code digital error signal into a binary digital error signal.

15. A voltage controller comprising:
a compensator including a lookup table for determining a digital control signal based on a digital error signal;
a modulator operative to provide a power control signal in response to said determined digital control signal; and
a delay line analog to digital converter operative to compare a converter voltage to a reference voltage and generate said digital error signal indicative of a difference between said compared voltages;
wherein said modulator comprises a delay line operative to determine a component of a pulse-on period for said power control signal.

16. A voltage controller comprising:
a compensator including a lookup table for determining a digital control signal based on a digital error signal;
a modulator operative to provide a power control signal in response to said determined digital control signal; and
a delay line analog to digital converter operative to compare a converter voltage to a reference voltage and generate said digital error signal indicative of a difference between said compared voltages;
wherein said modulator comprises;
a counter operative to determine a first component of a pulse-on period for said power control signal; and
a delay line operative to determine a second component of said pulse-on period for said power control signal.

17. A method for controlling voltage, the method comprising:
comparing a converter output voltage with a reference voltage;
generating a digital error signal indicative of a result of said comparing; and
providing a power control signal indicative of said generated error signal, wherein signal processing of said comparing, said generating, and said providing are performed entirely with digital logic gates.

18. The method of claim 17 wherein said comparing comprises powering a plurality of an array of delay cells with said converter output voltage.

19. The method of claim 17 wherein said comparing comprises measuring an extent of test signal propagation through an array of delay cells, said delay cells being powered by said converter output voltage.

20. The method of claim 17 wherein said providing comprises determining said power control signal from said generated error signal according to a control algorithm.

21. The method of claim 20 wherein said determining comprises selecting a lookup table entry based on a value of said generated error signal.

22. The method of claim 17 wherein said providing comprises determining a duty ratio from said generated error signal according to a control algorithm.

23. A method of controlling a regulator output voltage, the method comprising:
- receiving said regulator output voltage;
- converting said received regulator output voltage into a digital error signal employing a delay line analog to digital converter (ADC); and
- adjusting said regulator output voltage to an adjusted regulator output voltage based on said digital error signal;
- wherein said converting comprises:
  - powering a delay cell array of said delay line ADC with said received regulator output voltage;
  - measuring a speed of test signal propagation through said powered delay cell array; and
  - generating said digital error signal indicative of said measured test signal propagation speed.

24. The method of claim 23 wherein said converting further comprises calibrating said delay line ADC.

25. The method of claim 24 wherein said calibrating comprises:
- converting a reference voltage into a reference conversion error value employing said delay line ADC; and
- adding said reference conversion error value to said digital error signal, thereby providing a corrected digital error signal.

26. The method of claim 24 wherein said calibrating comprises:
- powering said delay cell array for said calibrating with a reference voltage;
- measuring a calibration speed of test signal propagation through said reference voltage-powered delay cell array;
- generating a reference conversion error value indicative of said measured calibration test signal propagation speed; and
- adding said reference conversion error value to said generated digital error signal.

27. The method of claim 23 wherein said adjusting comprises determining a digital control signal based on said generated digital error signal according to a control algorithm.

* * * * *